United States Patent
Gerlach et al.

(10) Patent No.: US 6,518,855 B1
(45) Date of Patent: Feb. 11, 2003

(54) INTEGRATED CIRCUIT FOR MOBILE RADIO AND MOBILE TELEPHONE INSTALLATIONS

(75) Inventors: Udo Gerlach, München (DE); Andreas Weisgerber, München (DE)

(73) Assignee: Infineon Technologies AG, München (DE)

( * ) Notice: Subject to any disclaimer, the term of this patent is extended or adjusted under 35 U.S.C. 154(b) by 0 days.

(21) Appl. No.: 09/623,936

(22) PCT Filed: Mar. 3, 1999

(86) PCT No.: PCT/DE99/00571

§ 371 (c)(1),
(2), (4) Date: Feb. 5, 2001

(87) PCT Pub. No.: WO99/46859

PCT Pub. Date: Sep. 16, 1999

(30) Foreign Application Priority Data

Mar. 11, 1998 (DE) .......................................... 198 10 557

(51) Int. Cl.[7] .................................................. H01P 5/12
(52) U.S. Cl. ........................... 333/103; 455/78; 333/101
(58) Field of Search ................................. 333/103, 101; 455/78, 82, 101, 121

(56) References Cited

U.S. PATENT DOCUMENTS

| | | | |
|---|---|---|---|
| 4,637,073 A | 1/1987 | Selin et al. ..................... 455/78 |
| 5,081,706 A | 1/1992 | Kim ............................... 455/78 |
| 5,548,239 A | 8/1996 | Kohama ........................ 327/408 |
| 5,689,818 A | 11/1997 | Caglio et al. .................. 455/83 |
| 5,715,525 A | * 2/1998 | Tarusawa et al. ............ 455/101 |
| 5,903,178 A | * 5/1999 | Miyatsuji et al. ............ 327/308 |
| 5,913,153 A | * 6/1999 | Nakamoto et al. ............ 455/78 |
| 5,926,466 A | * 7/1999 | Ishida et al. ................. 370/280 |
| 6,072,993 A | * 6/2000 | Trikha et al. .................. 455/78 |

FOREIGN PATENT DOCUMENTS

| | | | |
|---|---|---|---|
| DE | 196 44 448 A1 | 7/1997 | ............ H04B/1/44 |
| EP | 0 744 831 A2 | 11/1996 | ............ H03H/7/46 |
| EP | 0 751 631 A1 | 1/1997 | ............ H04B/7/04 |
| JP | 09055682 | 2/1997 | ............ H04B/1/58 |

OTHER PUBLICATIONS

Miyatsuji et al.: "A GaAs Single Voltage Controlled RF Switch IC", 2334c IEICE Transactions on Electronics E78–C (1995) Aug., No. 8, Tokyo, Japan, pp. 931–935.
Kohama et al.: "High Power DPDT Antenna Switch MMIC for Digital Cellular Systems", IEEE Journal of Solid–state Circuits, vol. 31, No. 10, Oct. 1996, pp. 1406–1411.

* cited by examiner

Primary Examiner—Robert Pascal
Assistant Examiner—Dean Takaoka
(74) Attorney, Agent, or Firm—Laurence A. Greenberg; Werner H. Stemer; Gregory L. Mayback

(57) ABSTRACT

Microwave circuit arrangement containing one or more semiconductor switching elements, which are characterized in that at least one semiconductor switching element is controlled or switched by alteration of the drain and source potentials, and for use of these circuits in mobile telephones or mobile radio transceivers.

9 Claims, 2 Drawing Sheets

INTEGRATED CIRCUIT FOR MOBILE RADIO AND MOBILE TELEPHONE INSTALLATIONS

BACKGROUND OF THE INVENTION

Field of the Invention

Figure 1:
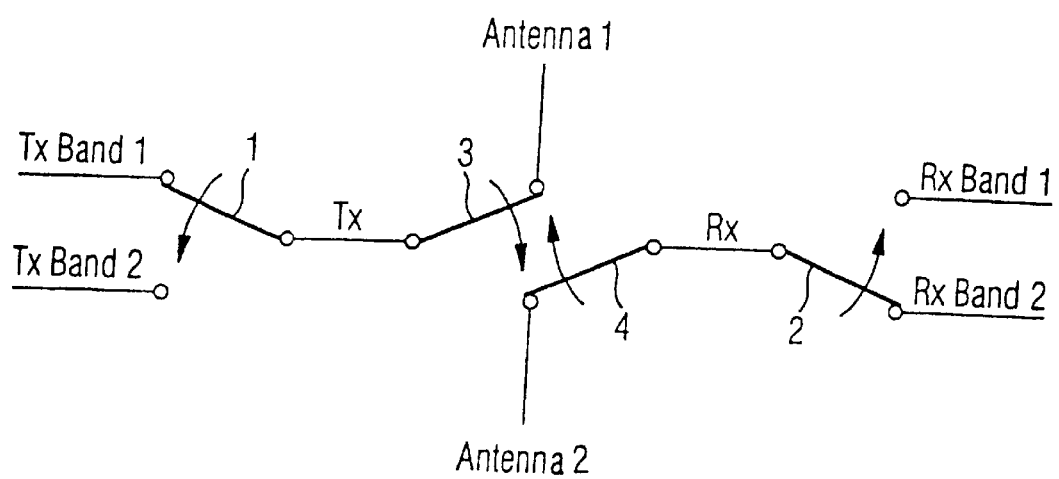

The invention relates to a microwave circuit arrangement according to claim 1 and its use in mobile telephones or mobile radio transceivers.

It is desirable to operate mobile-radio and mobile-telephone systems not only outside but also in the interior of vehicles. In the interior of the vehicles the transmitting and receiving sections of the mobile-radio and mobile-telephone systems are not connected to the built-in antenna but to an external antenna fitted to the vehicle. Semiconductor switching circuits arranged within the mobile-radio and mobile-telephone systems are usually used for changing over the connection between transmitter, receiver, antenna 1 (external) and antenna 2 (internal).

The publication IEEE Journal of Solid-State Circuits, Vol. 31, No. 10, October 1996 describes an antenna changeover for high-power microwaves. The arrangement, which is constructed monolithically with the aid of GaAs JFET semiconductor switching elements, enables the connection of a transmitter ($T_x$) to an external antenna and an internal antenna, or the connection of a receiver ($R_x$) to one of said antennas. In the case of the switching arrangement described, two states can be switched, in the case of each of which an input is connected to an output. By way of example, if the internal antenna built into the device is connected to the receiver, the external antenna is connected to the transmitter. In the second switching state, the built-in antenna is connected to the transmitter and the external antenna is connected to the sreceiver. Two input signals are required for controlling these two states (2 bits).

SUMMARY OF THE INVENTION

The object of the present invention is to provide an antenna changeover circuit arrangement which enables a changeover between transmitter/receiver and antenna 1/antenna 2 and at the same time, affords a possibility for changing over the mobile-radio and mobile-telephone system between two frequency bands (e.g. between GSM mode and PCN mode in dual-band mobile telephones).

The invention relates to a microwave circuit arrangement in accordance with claim 1.

The driving of the semiconductor switching elements by alteration of the potential at drain and source in accordance with the invention makes it possible to reduce the drive lines required for coding the switching states by comparison with exclusive driving by alteration of the potential at the gates.

Examples of semiconductor switching elements which can be used in accordance with the invention are field effect transistors known per se, such as MESFETs, JFETs or MOSFETs. Those types which are suitable for switching high power levels are preferred. The control voltage of the semiconductor switching elements is advantageously in the region of less than 5 V, in particular 3 V.

It is possible for the circuit according to the invention to be constructed from discrete components. However, all of the semiconductor switching elements are preferably integrated on a circuit, for example in the form of a Monolithic Microwave Circuit (MMIC). The chip area to which the circuit according to the invention can be applied is preferably smaller than $1200 \times 1200 \, \mu m^2$. It is particularly preferred for the chip area to be smaller than $800 \times 800 \, \mu m^2$.

The integrated circuit is preferably accommodated in a chip carrier housing. The connections can then be routed to the outside in a customary manner via bonding.

The driving of the switching elements in the circuit by changing potential can be effected by means of control lines. If a control line is used to switch a specific function, additional circuit sections with additional coding logic are unnecessary. It is therefore preferred for there to be no circuit sections of hybrid construction present in the circuit arrangement according to the invention.

The circuit according to the invention is preferably operated with an operating voltage. In other words, there is only one operating or supply voltage, with a constant value, applied to the circuit. Additional supply voltages are not required.

The circuit according to the invention can be used quite generally for changing over between signal sources in the microwave range (preferably from 500 to 2500 MHz). It is preferred, however, for the circuit according to the invention to be connected to at least two transmitting apparatuses and at least two receiving apparatuses.

The circuit according to the invention can be used for antenna changeover in dual-band mobile telephones with two transmitting and receiving sections in each case. It is thus preferred for the circuit to be connected to two or more transmitters and to two or more receivers, in which case the transmitters and receivers respectively differ in that they operate on different frequency bands.

The circuit according to the invention can be utilized for changing over between transmitters and receivers onto one antenna. It is preferred for the circuit to be connected to at least two antennas.

A further possibility is changeover between an internal antenna and an external antenna. Therefore, the circuit according to the invention is preferably connected to two or more antennas.

In a particularly preferred manner, two transmitters, two receivers and two antennas are connected to one another by the circuit according to the invention.

There are expediently at least two semiconductor switching elements present in the circuit according to the invention, which elements can be switched complementarily with respect to one another, and in which case said semiconductor switching elements are directly electrically decoupled from one another. Preferably, one of the two semiconductor switching elements which are switched complementarily with respect to one another is controlled or switched by alteration of the drain and source potentials, and the other by alteration of the gate potential.

The circuit according to the invention is configured such that a negative operating or supply voltage is not present.

The circuit according to the invention can particularly advantageously be used as antenna changeover in mobile telephones or mobile radio transceivers. The circuit can preferably be used for mobile telephones or mobile radio transceivers which operate in two bands.

A further advantage of the microwave circuit arrangement according to the invention is that, in contrast to the changeover by means of conventional circuit arrangements without direct electrical decoupling of the complementarily switched semiconductor switching elements, it is possible to work with a smaller number of drive lines. It is also an advantage that the circuit manages with just a single supply voltage. Furthermore, the circuit arrangement according to the invention can be produced in a space-saving and cost-effective manner, since no coding logic is required for controlling the switching states. It is also advantageous that the circuit can be produced without complicated hybrid techniques.

A further advantage of the invention is that a microwave circuit arrangement is provided which enables a changeover between the antennas and the transmitters or receivers of the respective bands, and which requires only three lines for driving its circuit states.

A further advantage is that this microwave circuit arrangement can be realized with a low outlay on circuitry.

EXAMPLE

FIG. 1 shows a basic circuit diagram for an antenna changeover according to the invention. In the circuit state in FIG. 1, a first transmitter ($T_x$), which is used for frequency band 1, is connected to antenna 1 (external antenna). In this circuit state, the receiver ($R_x$) for frequency band 2 is connected to antenna 2 (internal antenna). In the second circuit state, the switches 1 and 2 switch over. In the third circuit state, the switching elements 3 and 4 change their state.

Figure 2:
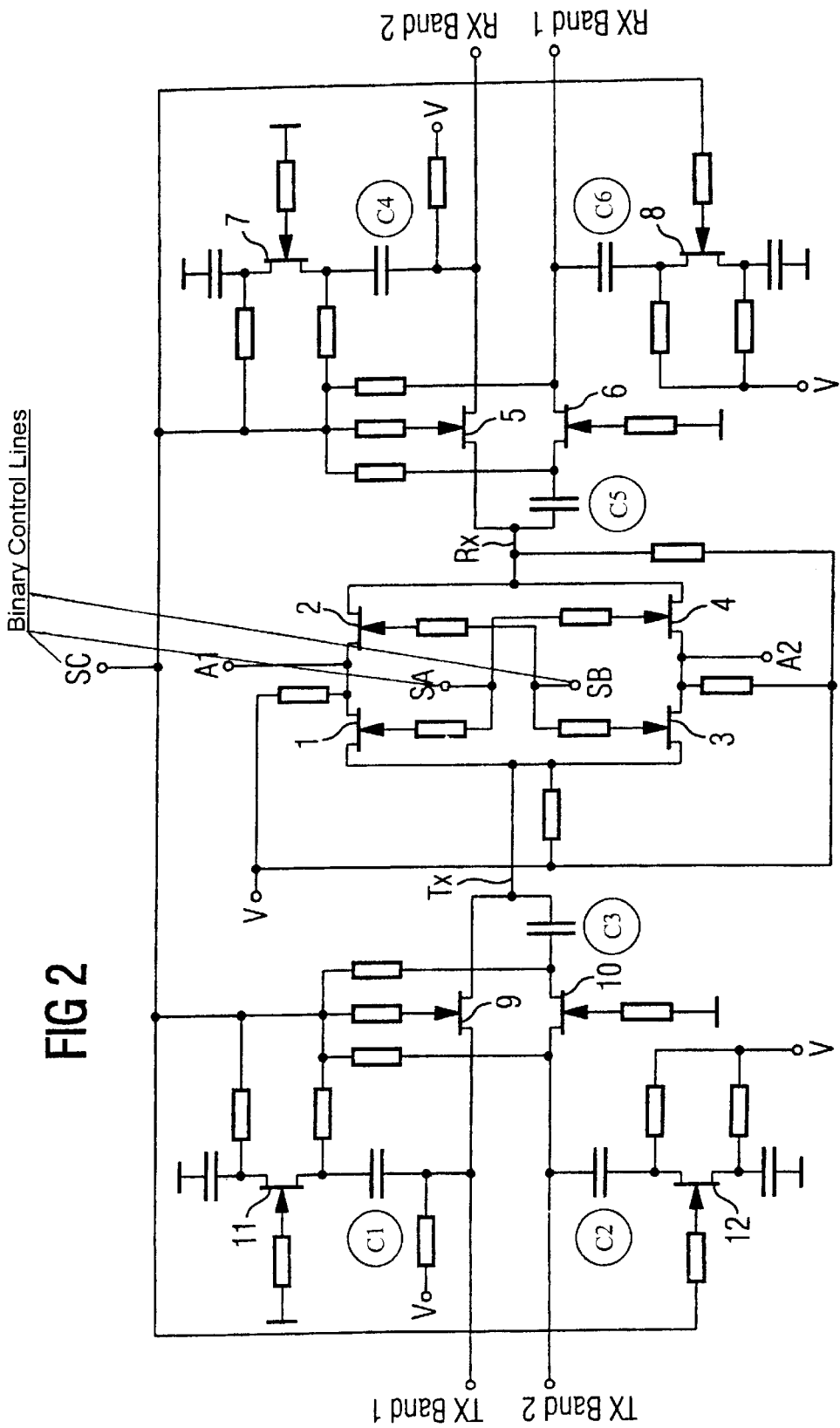

FIG. 2 shows a possibility for the realization of this switch according to the invention with three control lines SA, SB and SC. The circuit is constructed monolithically in an integrated manner. The circuit is produced in a manner known per se. The connection of the antennas (A1 or A2) to the respective transmitters or receivers is realized using MESFET transistors. The transistors which are in each case switched complementarily are directly electrically decoupled by means of capacitors. The power supply is effected by a positive supply voltage V.

The switch 1 of FIG. 1 is formed by the FETs 9 to 12 of FIG. 2. In particular, FETS 9 and 11 as well as 10 and 12, respectively, are working together to connect Tx Band 1 or Tx Band 2 with terminal Tx. The FETs 9 to 12 are controlled by the potential applied to terminal SC. If this potential is high, FETs 9 and 12 are opened, whereas FET 10 and 11 are closed. FETs 9 and 12 are controlled by varying the gate potential, and FETs 11 and 10 are controlled by varying the potentials of the source and the drain.

To this end, the gates of FETs 9 and 12 are connected with terminal SC. By varying the electrical potential of terminal SC, FETs 9 and 12 can be opened and closed respectively. On the other hand, the gates of FETs 10 and 11 are grounded, which means that the electrical potential of these gates remains fixed. These FETs are opened and closed by varying the electrical potential applied to the source and drain, which are connected with terminal SC.

In order to control the FETs by varying the gate or the source/drain potential respectively, a galvanical decoupling is required to raise or decrease the electrical potential of the source and the frain of one FET, independently to the electrical potential of the gate of another FET. The capacitors C1 to C3 of FIG. 2 decouple FET 11 from FET 9, FET 9 from FET 10, and FET 11 from FET 12, respectively.

The switch 2 of FIG. 1 is formed by FETs 5 to 8 of FIG. 2, and functions in the same way as switch 1 does.

The circuit of FIG. 2 has the advantage that only three control lines are needed. Generally, to open a FET and to close another FET, two control lines with different electrical potential are required. The control line with the high electrical potential will close one FET, whereas the control line with the low electrical potential will open the other FET.

Consequently, a logic circuit is required to provide a high and a low electrical potential. This can be done for instance by an inverter. Since a logic circuit is difficult to form in a GaAs substrate (which forms the basis of microwave devices), a logic circuit on silicon is often integrated into the GaAs substrate. This is usually termed as "hybrid" construction.

What is claimed is:
1. A microwave circuit configuration, comprising:
a plurality of semiconductor switching elements each having a drain, a source, and a gate, said semiconductor switching elements being switchable complementarily with respect to one another and being configured to switch between at least two antennas, at least two transmitters, and at least two receivers, wherein the transmitters and the receivers operate on mutually different frequency bands;
at least two of said semiconductor switching elements being galvanically decoupled from one another, wherein one of said at least two semiconductor switching elements is driven by alteration of the drain and source potentials, and another of said at least two semiconductor switching elements is driven by alteration of a gate potential;
a first terminal, a second terminal, a terminal for a first transmission frequency band, a terminal for a second transmission frequency band, a terminal for a first reception frequency band, a terminal for a second frequency band, a terminal for a first antenna, and a terminal for a second antenna;
a first switch connected to said first terminal, said first switch changing over between said terminal for the first transmission frequency band and said terminal for the second transmission frequency band;
a second switch connected to said first terminal, said second switch changing over between said terminal for the first antenna and said terminal for the second antenna;
a third switch connected to said second terminal, said third switch changing over between said terminal for the second antenna and said terminal for the first antenna, wherein said second switch and said third switch are each connected to different antennas; and
a fourth switch connected to said second terminal, said fourth switch changing over between said terminal for the first reception frequency band and said terminal for the second frequency band;
wherein the circuit has three circuit states, including:
a first circuit state in which said first switch is connected to said terminal for the first transmission frequency band, said second switch is connected to said terminal for the first antenna, said third switch is connected to said terminal for the second antenna, and said fourth switch is connected to said terminal for the second reception band;
a second circuit state in which said first switch is connected to said terminal for the second transmission frequency band, said fourth switch is connected to said terminal for the first reception frequency band, said second switch is connected to said terminal for the first antenna, and said third switch is connected to said terminal for the second antenna; and
a third circuit state in which said first switch is connected to said terminal for the second transmission frequency band, said fourth switch is connected to said terminal for the first reception frequency band, said second switch is connected to said terminal for the second antenna, and said third switch is connected to said terminal for the first antenna.

2. The circuit configuration according to claim 1, wherein all of said semiconductor switching elements are integrated on a circuit.

3. The circuit configuration according to claim 1, which comprises no circuit sections of hybrid construction.

4. The circuit configuration according to claim 1, which comprises a terminal for an operating voltage, wherein the circuit configuration is operated with the operating voltage.

5. The circuit configuration according to claim 1, which comprises three binary control lines for setting the possible circuit states.

6. The circuit configuration according to claim 1, which comprises only one operating voltage having a constant value.

7. The circuit configuration according to claim 1, which comprises only one supply voltage having a constant value.

8. In combination with a mobile radio, the circuit configuration according to claim 1.

9. In combination with a mobile radio transceiver, the circuit configuration according to claim 1.

\* \* \* \* \*